United States Patent [19]
Ahn

[11] Patent Number: 6,134,158
[45] Date of Patent: Oct. 17, 2000

[54] SEMICONDUCTOR DEVICE HAVING A PLURALITY OF REDUNDANCY INPUT/OUTPUT LINES

[75] Inventor: Ki-Yong Ahn, Yicheon, Rep. of Korea

[73] Assignee: Hyundai Electronics Industries Co., Ltd., Gyunggi-Do, Rep. of Korea

[21] Appl. No.: 09/200,452

[22] Filed: Nov. 27, 1998

[30] Foreign Application Priority Data

Dec. 31, 1997 [KR] Rep. of Korea ...................... 97-82296

[51] Int. Cl.[7] ................................................. G11C 7/00
[52] U.S. Cl. ...................................... 365/200; 365/225.7
[58] Field of Search ................................ 365/200, 225.7, 365/189.02, 189.05

[56] References Cited

U.S. PATENT DOCUMENTS

| | | | |
|---|---|---|---|
| 4,691,300 | 9/1987 | Pelley, III et al. | 365/200 |
| 4,791,319 | 12/1988 | Tagami et al. | 365/200 |
| 5,179,536 | 1/1993 | Kasa et al. | 365/200 |
| 5,224,073 | 6/1993 | Nakayama | 365/200 |
| 5,243,570 | 9/1993 | Saruwatari | 365/201 |
| 5,502,675 | 3/1996 | Kohno et al. | 365/200 |
| 5,617,364 | 4/1997 | Hatakeyama | 365/200 |
| 5,652,725 | 7/1997 | Suma et al. | 365/200 |
| 5,661,689 | 8/1997 | Shinkai | 365/200 |
| 5,677,881 | 10/1997 | Seo et al. | 365/200 |
| 5,761,138 | 6/1998 | Lee et al. | 365/200 |

*Primary Examiner*—Son Mai
*Attorney, Agent, or Firm*—Oliff & Berridge, PLC

[57] ABSTRACT

The semiconductor device having a plurality of redundancy input/output lines is disclosed. The device includes a plurality of input/output lines through which data are transmitted, a plurality of redundancy input/output lines, a plurality of data bus lines connected with the input/output lines and the redundancy input/output lines, respectively, a plurality of switching units connected with the redundancy input/output lines and the data bus lines, and a redundancy circuit connected with the switching units and connected with one among the input/output lines and one among the data bus lines for thereby repairing a plurality of defective input/output lines by providing a plurality of redundancy input/output lines.

18 Claims, 5 Drawing Sheets

Fig. 2A
Conventional Art
Fig. 2B
Conventional Art
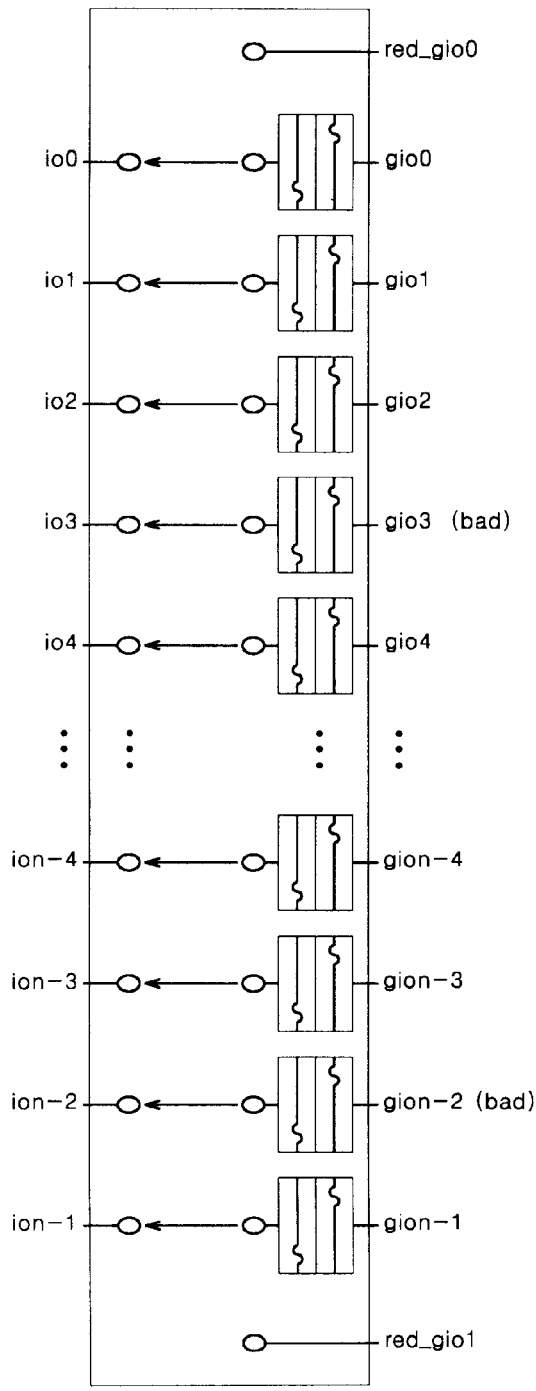
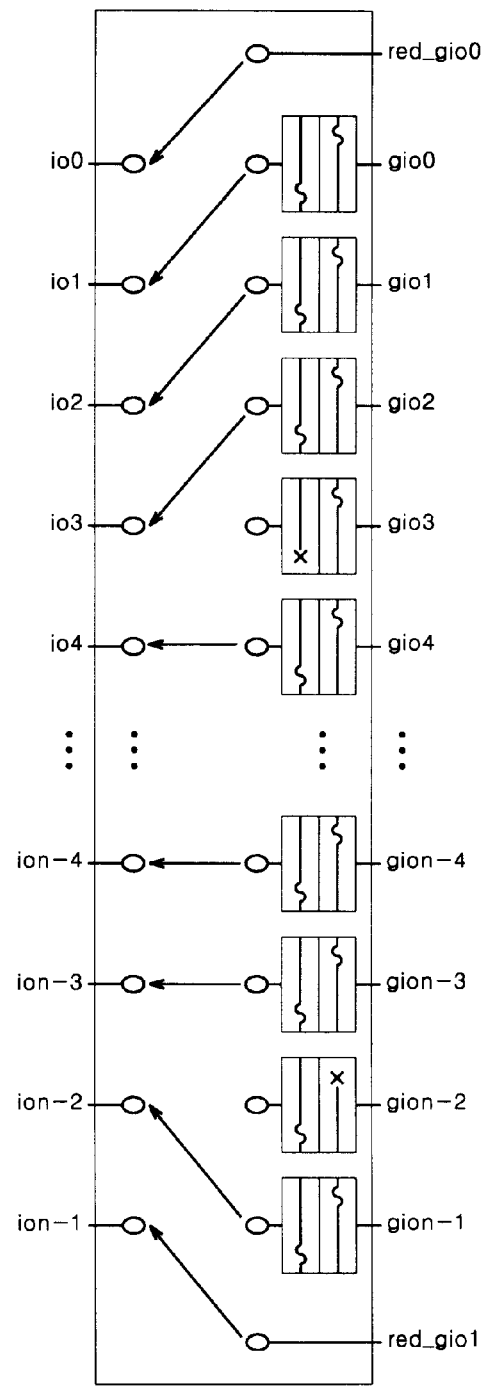

SEMICONDUCTOR DEVICE HAVING A PLURALITY OF REDUNDANCY INPUT/OUTPUT LINES

BACKGROUND OF THE INVENTION

1. Field of the Invention

The present invention relates to a semiconductor device, and in particular, to a semiconductor device having a plurality of redundancy input/output lines which is capable of repairing a plurality of defective input/output lines by providing a plurality of redundancy input/output lines.

2. Description of the Conventional Art

The semiconductor memory device having a DRAM (Dynamic Random Access Memory) includes a redundancy circuit for thereby enhancing a yield by changing a defective memory cell with a redundancy cell as an extra-memory cell when there is a defective memory cell. As the redundancy circuit, there are a row redundancy circuit, a column redundancy circuit, an input/output redundancy circuit, etc. Namely, the row, column and input/output circuits including a defective memory cell are substituted with a row, column and input/output circuit. In the case of the merged memory logic semiconductor device, there is a multiplex input/output structure having many input/output bits for increasing the width of the data band. In this memory, there is not a difficulty for using the conventional row redundancy structure. However, when using the conventional redundancy structure, too many redundancy columns are needed for a substitution of one column selection line. For example, if the number of input/output lines is 128, 128 redundancy columns are needed. Therefore, the memory of the conventional multiplex input/output structure uses an input/output redundancy structure instead of the known column redundancy circuit.

FIG. 1 illustrates an input/output redundancy global circuit for a conventional semiconductor device. As shown therein, redundancy global input/output lines red_gio0 and red_gio1 are connected at both ends of a memory cell array 111, respectively. First fuse circuits 131 and second fuse circuits 141 controlling the redundancy input/output lines red_gio0 and red_gio1 are connected between input/output detection amplifiers 121 and the memory cell arrays 111. The second fuse circuits 141 each are connected with the global input/output lines gio0 through gion-1, respectively. Each of the two first fuse circuits 131 is connected with both ends of each of the second fuse circuits 141. The first fuse circuits 131 each include one fuse. The second fuse circuits 141 each include two fuses. Therefore, the number of fuses is (2n+2), where n represents the number of input/output lines.

In addition, red_giob0 and red_giob1 are complementary redundancy global input/output lines receiving signals different from the signal level applied to the global input/output lines gio0~gion-1.

The first fuse circuits 131 supply the power voltage Vdd to the second fuse circuits 141 when the internal fuses are connected and supply the ground voltage to the second fuse circuits 141 Vss when the fuses are disconnected. The second fuse circuits 141 connect the global input/output lines gio0~gion-1 and the input/output lines io0~ion-1 to the initial connection state of the same when the internal fuses are connected. When the internal fuses are disconnected, the leftside or rightside global input/output lines are connected with the input/output lines.

FIGS. 2A and 2B illustrate a state before and after a repair with respect to an input/output line based on a conventional input/output redundancy circuit.

As shown in FIG. 2A, in the leftside, the global input/output line gio3 is defective, and in the rightside, the global input/output line gion-2 is defective. In order to repair the defective global input/output lines gio3 and gion-2, the connection as shown in FIG. 2B is implemented. As shown in FIG. 2B, the leftside fuse connecting the input/output line io3 and the global input/output line gio3 is disconnected. In addition, the input/output line io0 is connected with the redundancy global input/output line red_gio0, and the input/output line io1 is connected with the global input/output line gio0, and the input/output line io2 is connected with the global input/output line gio1, and the input/output line io3 is connected with the global input/output line gio2. However, the input/output line io4 is connected with the global input/output line gio4.

In addition, the rightside fuse connecting the input line ion-2 and the global input/output line gion-2 is disconnected. The input/output line ion-1 is connected with the redundancy global input/output line red_gio1, and the input/output line ion-2 is connected with the global input/output line gion-1. The input/output line ion-3 is connected with the global input/output line gion-3, and the input/output line ion-4 is connected with the global input/output line gion-4.

In the conventional input/output redundancy structure, it is adapted when less than two redundancy input/output lines are adapted. When more than three redundancy input/output lines are needed, it is impossible to adapt the same.

SUMMARY OF THE INVENTION

Accordingly, it is an object of the present invention to provide an input/output redundancy circuit for a semiconductor device which overcomes the aforementioned problems encountered in the conventional art.

It is another object of the present invention to provide an input/output redundancy circuit for a semiconductor device which is capable of repairing a plurality of redundancy input/output lines.

In order to achieve the above objects, there is provided a semiconductor device which includes a plurality of input/output lines through which data are transmitted, a plurality of redundancy input/output lines, a plurality of data bus lines connected with the input/output lines and the redundancy input/output lines, respectively, a plurality of switching units connected with the redundancy input/output lines and the data bus lines, respectively, and a redundancy circuit connected with the switching units and connected with one among the input/output lines and one among the data bus lines.

Preferably, there are further provided a first fuse circuit for controlling a connection state between an input/output line and a data bus, and a second fuse circuit for controlling a connection state between a data bus and a redundancy input/output line based on a combination of an output from the first fuse circuit and an internal circuit.

More preferably, the second fuse circuit controls a connection state between a data bus and a redundancy input/output line based on a combination of an external control signal and an internal circuit, and the first fuse circuit includes a fuse to which a power voltage is applied and a MOS transistor connected with the fuse for thereby outputting a ground voltage when the fuse is disconnected and outputting a power voltage when the fuse is connected.

More preferably, the second fuse circuit includes a fuse block for outputting a power voltage or a ground voltage, a logic circuit for enabling one output among a plurality of outputs in accordance with an output from the fuse block, and a switching unit for outputting an output of a logic gate in response to an output from the first fuse circuit. The fuse block includes a fuse and the first and second fuse circuit output a power voltage or a ground voltage in accordance with a connection state of the fuse. The switching unit includes a plurality of transmission gates gate-connected by a control signal and transmitting an output of the logic gate, and a plurality of NMOS transistors gated by the control signal and disabling the outputs from the transmission gates.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A and 2B are views illustrating a state before and after a repair with respect to an input/output line based on a conventional input/output redundancy circuit;

DETAILED DESCRIPTION OF THE INVENTION

The embodiments of the present invention will be explained with reference to the accompanying drawings.

Figure 1:
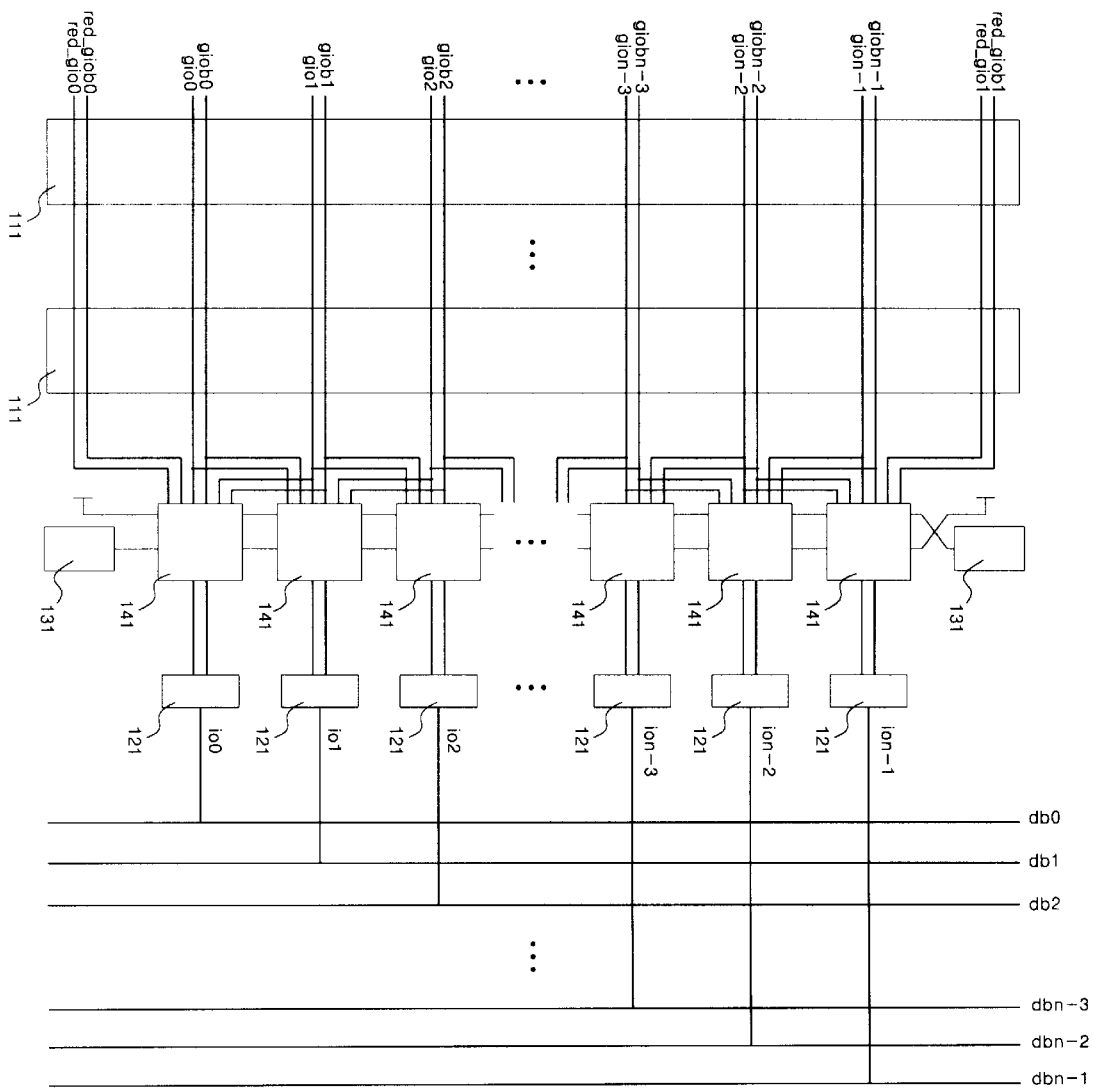
FIG. 1 is a circuit diagram illustrating an input/output redundancy circuit for a conventional semiconductor device.
Figure 3:
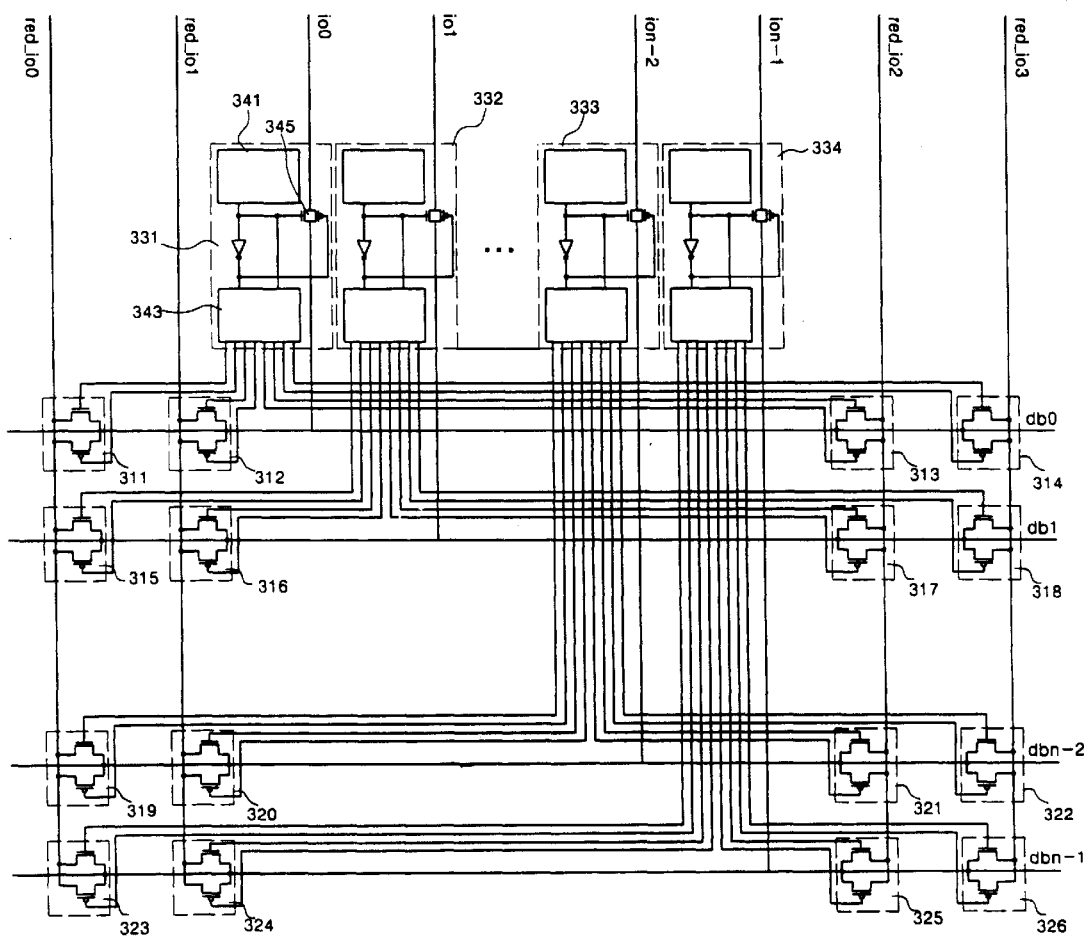
FIG. 3 is a schematic circuit diagram illustrating a semiconductor device having an input/output redundancy circuit according to the present invention.

FIG. 3 illustrates a semiconductor device having an input/output redundancy circuit according to the present invention. As shown therein, there are provided a plurality of input/output lines io0~ion-1, a plurality of redundancy input/output lines red_io0~red_io3, a plurality of data bus lines db0~dbn-1, a plurality of switching units 311~326, and a plurality of redundancy circuits 331~334.

The data bus lines db0~dbn-1 are connected with the input/output lines io-~ion-1 and the redundancy input/output lines red_io0~red_io3, respectively.

The switching units 311~326 are connected with the redundancy input/output lines red_io0~red_io3, and the data bus lines db0~dbn-1, respectively.

The redundancy circuits 331~334 are connected with the switching units 311~326 and are connected with one among the input/output lines io0~ion-1 and one among the data bus lines db0~dbn-1.

The redundancy circuits 331~334 each include first fuse circuits 341 and second fuse circuits 343.

The first fuse circuits 341 control a connection state between the input/output lines io0~ion-1 and the data bus lines db0~dbn-1 through the transmission gates 345. Namely, if the outputs from the first fuse circuits 341 are high levels, the transmission gates 345 are turned on, so that the data buses db0~dbn-1 and the input/output lines io0~ion-1 maintain an original connection system, and if the outputs from the first fuse circuits 341 are low levels, the transmission gates 345 are turned off, so that the data buses db0~dbn-1 and the input/output lines io0~ion-1 are disconnected.

The second fuse circuits 343 control a connection state between the data buses db0~dbn-1 and the redundancy input/output lines red_io0~red_io3 through the switching units 311~326 based on a combination of the output from the first fuse circuits 341 and an internal circuit. For example, if the outputs from the second fuse circuits 343 are low levels, the switching units 311~326 are turned off, so that the data buses db0~dbn-1 and the redundancy input/output lines red_io0~red_io3 are disconnected, and if the outputs of the second fuse circuits 343 are high levels, the switching units 311~326 are turned on, so that the data buses db0~dbn-1 and the redundancy input/output lines red_io-~red_io3 are connected.

Figure 4:
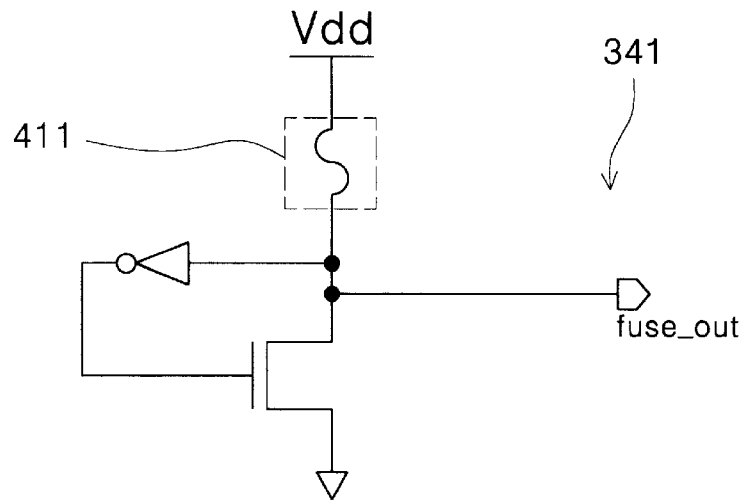
FIG. 4 is a circuit diagram illustrating the first fuse circuit of FIG. 3.

FIG. 4 illustrates one of the first fuse circuits 341 as shown in FIG. 3. As shown therein, the first fuse circuit 341 includes a fuse 411 receiving a power voltage Vdd and a MOS transistor 413 connected with the fuse 411. If the fuse 411 is disconnected, the first fuse circuit 341 outputs a ground voltage Vss, and if the fuse 411 is connected, the same outputs a power voltage Vdd.

Figure 5:
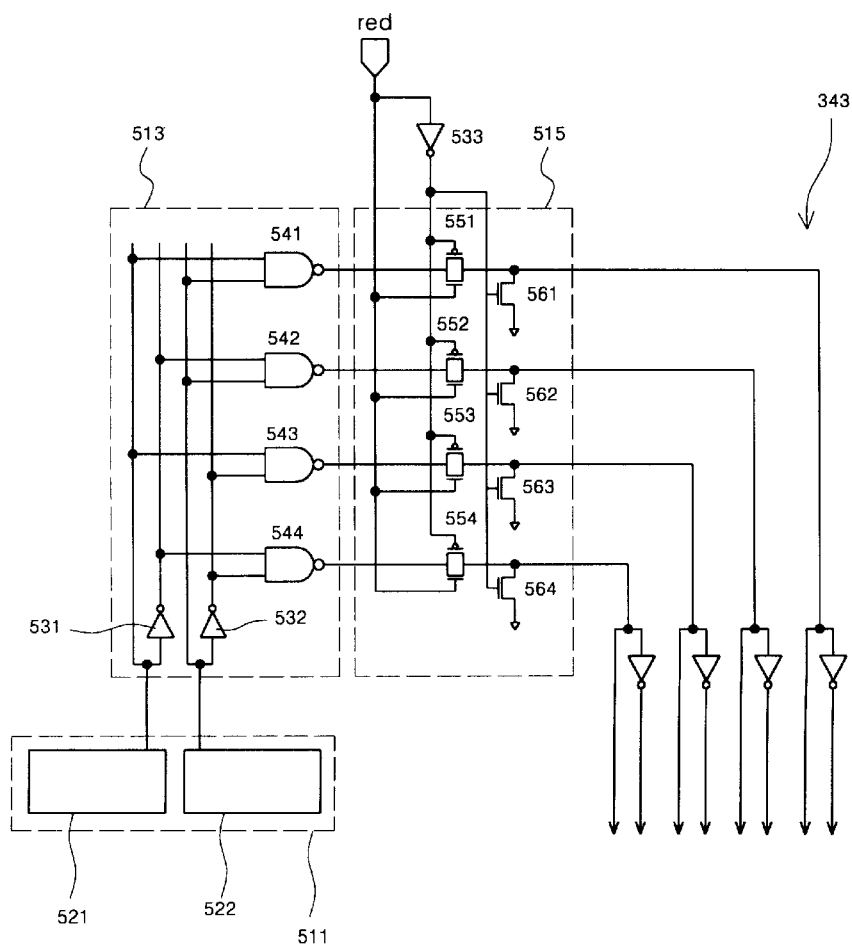
FIG. 5 is a circuit diagram illustrating the second fuse block of FIG. 3.

FIG. 5 illustrates one of the second fuse circuits 343 as shown in FIG. 3. As shown therein, the second fuse circuit 343 includes a fuse block 511 outputting a power voltage Vdd or a ground voltage Vss, a logic gate 513 enabling one output among a plurality of outputs in accordance with an output from the fuse block 511, and a switching unit 515 for transmitting an output of the logic gate 513 in response to an output from the first fuse circuit 341.

The fuse block 511 includes third and fourth fuse circuits 521 and 522 outputting a power voltage or a ground voltage in accordance with a connection state of the fuse. Since the construction and operation of the third and fourth fuse circuits 521 and 522 are the same as the first fuse circuit 341 as shown in FIG. 4, the description thereof will be omitted.

The logic gate 513 includes first and second inverters 531 and 532, and first through fourth NAND units 541~544. A part of the output from the third fuse circuit 521 is inputted into the first and third NAND units 541 and 543, and another part of the output from the same is inputted into the second and fourth NAND units 542 and 544 through the inverter 531. A part of the output from the fourth fuse circuit 522 is inputted into the first and second NAND units 541 and 542, and another part of the output from the same is inputted into the third and fourth NAND units 543 and 544 thorough the inverter 532. The logic gate 513 has four outputs. Enabling of an output among the above-described outputs is determined in accordance with the outputs from the third and fourth fuse circuits 521 and 522. For example, if the output from the third fuse circuit 521 and the output from the fourth fuse circuit 522 are all high levels, only the output from the NAND unit 541 becomes a low level, and the outputs from the remaining NAND units 542, 543 and 544 are all high levels.

The switching unit 515 includes a plurality of transmission gates 551~554 gated by the control signal "red" and transmitting the output from the logic gate 513 and a plurality of NMOS transistors 561~564 gated by the control signal "red" inverted by the inverter 533 and disabling the outputs from the transmission gates 551~554. The transmission gates 551~554 are turned on when the control signal "red" is a high level for thereby transmitting the output of the logic gate 513. The NMOS transistors 561~564 are connected with the output terminals of the transmission gates 551~554 and are turned off when the control signal "red" is a high level, so that the outputs from the transmission gates 551~554 are not influenced. If the control signal "red" is a low level, this signal is inverted by the inverter 533, so that a high level signal is applied to the gates of the NMOS transistors 561~564. Therefore, the NMOS transistors 561~564 are turned on, and the outputs from the transmission gates 551~554 are dropped to the ground voltage Vss level.

The outputs from the switching unit 515 are transmitted to the switching units 311~326 as shown in FIG. 3 for thereby selecting one among the redundancy input/output lines red_io0~red_io3. Therefore, if one output among the outputs from the switching units 515 of the second fuse circuit 343 is a high level, since the switching unit connected therewith is turned on, the data bus connected with the switching unit and the redundancy input/output line are electrically connected, so that it is possible to repair the defective memory cell.

The same result from the second fuse circuit 343 may be obtained using the first fuse circuit 341 output instead of the control signal "red".

The operations and construction of the redundancy circuits 331, 332, 333 and 334 are identical.

Figure 6A:
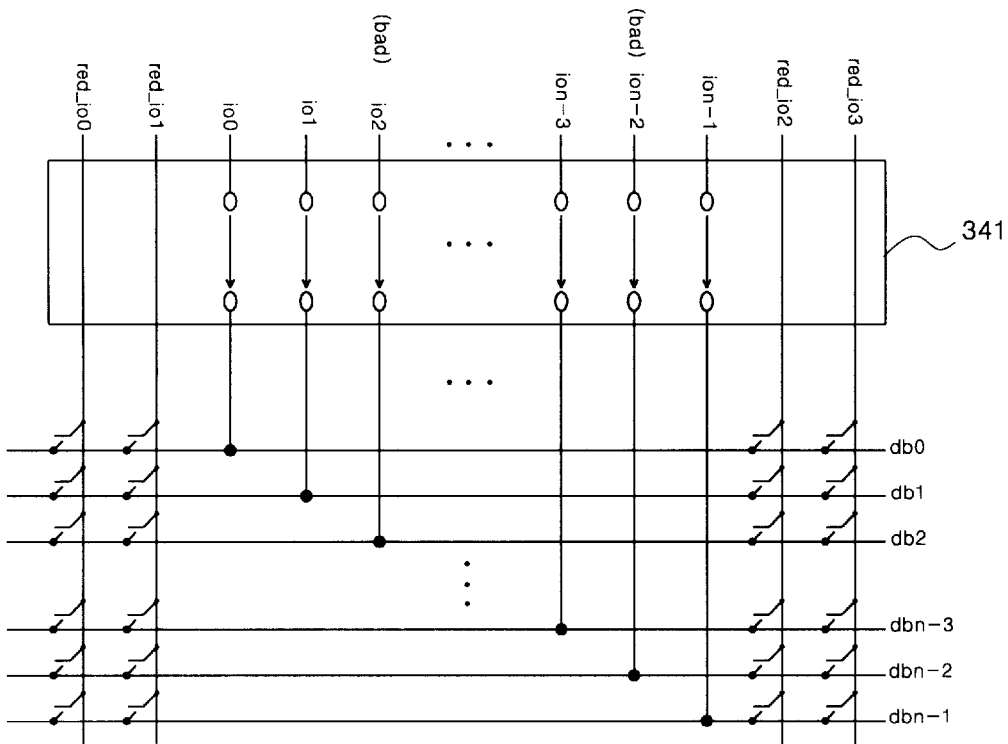
FIGS. 6A and 6B are views illustrating a state before and after a repair with respect to an input/output line based on an input/output redundancy circuit according to the present invention.
Figure 6B:
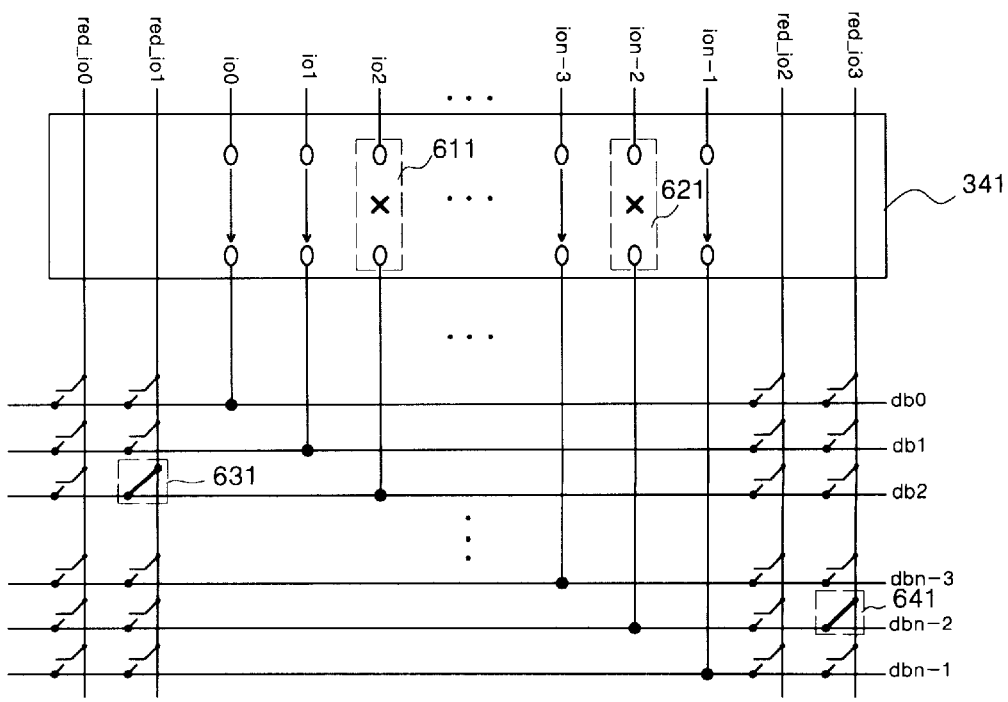

FIGS. 6A and 6B illustrate the state before and after a repair is performed with respect to the input/output line based on the input/output redundancy circuit according to the present invention. As shown in FIG. 6A, in the leftside, the input/output line io2 is defective, and in the rightside, the input/output line ion-2 is defective. In order to repair the defective input/output lines io2 and ion-2, the connection as shown in FIG. 6B is implemented. As shown in FIG. 6B, the fuse connecting the input/output line io2 and the data bus line db2 is disconnected. In addition, the data bus line db2 and the redundancy input/output line red_io1 are connected through the switching unit 631. The connection between the other input/output lines and the data bus lines are maintained.

As shown in FIG. 6B, the fuse 621 connecting the input/output line ion-2 and the data bus line dbn-2 is disconnected. In addition, the data bus line dbn-2 is connected with the redundancy input/output line red_io3 through the switching unit 641. The connection between the other input/output lines and the other data bus lines are maintained.

In the present invention, it is possible to repair the defective input/output lines as many as the number of redundancy input/output lines using a redundancy circuit based on a plurality of redundancy input/output lines and the redundancy circuit even when the input/output lines are defective.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device, comprising:
   at least one input/output line through which data is transmitted;
   a plurality of redundancy input/output lines;
   at least one data bus line connected with the at least one input/output line and the redundancy input/output lines, respectively;
   a plurality of switching means connected with the redundancy input/output lines and the at least one data bus line;
   a redundancy circuit connected with the switching means and connected with the at least one input/output line;
   a first fuse circuit controlling a connection state between the at least one input line and the at least one data bus line; and
   a second fuse circuit controlling a connection state between the at least one data bus line and each of the redundancy input/output lines based on a combination between the output from the first fuse circuit and an internal circuit.

2. The device of claim 1, wherein said switching means each are formed of a transmission gate.

3. A semiconductor device, comprising:
   at least one input/output line through which data is transmitted;
   a plurality of redundancy input/output lines;
   at least one data bus line connected with the at least one input/output line and the redundancy input/output lines, respectively;
   a plurality of switching means connected with the redundancy input/output lines and the at least one data bus line;
   a redundancy circuit connected with the switching means and connected with the at least one input/output line;
   a first fuse circuit controlling a connection state between the at least one input line and the at least one data bus line; and
   a second fuse circuit controlling a connection state between the at least one data bus line and each of the redundancy input/output lines based on a combination between an external control signal and an internal circuit.

4. The device of claim 1, wherein said first fuse circuit includes:
   a fuse through which the power voltage is applied; and
   a MOS transistor connected with the fuse and outputting a ground voltage when the fuse is disconnected and outputting a power voltage when the fuse is connected.

5. The device of claim 3, wherein said second fuse circuit includes:
   a fuse block outputting a power voltage or a ground voltage;
   a logic gate enabling one output among a plurality of outputs in accordance with an output from the fuse block; and
   a switching means transmitting an output of the logic gate in response to a control signal.

6. The device of claim 5, wherein said fuse block includes:
   a fuse; and
   wherein the first and second fuse circuits output a power voltage or a ground voltage in accordance with a connection state of the fuse.

7. The device of claim 5, wherein said switching means includes:
- a plurality of transmission gates gated in accordance with the control signal and transmitting an output of the logic gate; and
- a plurality of NMOS transistors gated in accordance with the control signal and disabling the outputs of the transmission gates.

8. The device of claim 1, wherein said second fuse circuit includes:
- a fuse block outputting a power voltage or a ground voltage;
- a logic gate enabling one output among a plurality of outputs in accordance with an output from the fuse block; and
- a switching means transmitting an output of the logic gate in response to the output from the first fuse circuit.

9. The device of claim 8, wherein said fuse block includes:
- a fuse; and
- wherein the first and second fuse circuits output a power voltage or a ground voltage in accordance with a connection state of the fuse.

10. The device of claim 8, wherein said switching means includes:
- a plurality of transmission gates gated in accordance with the output from the first fuse circuit and transmitting an output of the logic gate; and
- a plurality of NMOS transistors gated in accordance with the output from the first fuse circuit and disabling the outputs of the transmission gates.

11. The device of claim 1, wherein said second fuse circuit includes:
- a fuse block outputting a power voltage or a ground voltage;
- a logic gate enabling one output among a plurality of outputs in accordance with an output from the fuse block; and
- a switching means transmitting an output of the logic gate in response to an external control signal.

12. The device of claim 11, wherein said fuse block includes:
- a fuse; and
- wherein the first and second fuse circuits output a power voltage or a ground voltage in accordance with a connection state of the fuse.

13. The device of claim 11, wherein said switching means includes:
- a plurality of transmission gates gated in accordance with the control signal and transmitting an output of the logic gate; and
- a plurality of NMOS transistors gated in accordance with the control signal and disabling the outputs of the transmission gates.

14. The device of claim 3, wherein said switching means each are formed of a transmission gate.

15. The device of claim 3, wherein said first fuse circuit includes:
- a fuse through which the power voltage is applied; and
- a MOS transistor connected with the fuse and outputting a ground voltage when the fuse is disconnected and outputting a power voltage when the fuse is connected.

16. The device of claim 4, wherein said second fuse circuit includes:
- a fuse block outputting a power voltage or a ground voltage;
- a logic gate enabling one output among a plurality of outputs in accordance with an output from the fuse block; and
- a switching means transmitting an output of the logic gate in response to an output from the first fuse circuit.

17. The device of claim 16, wherein said fuse block includes:
- a fuse; and
- wherein the first and second fuse circuits output a power voltage or a ground voltage in accordance with a connection state of the fuse.

18. The device of claim 16, wherein said switching means includes:
- a plurality of transmission gates gated in accordance with the output of the first fuse circuit and transmitting an output of the logic gate; and
- a plurality of NMOS transistors gated in accordance with the output of the first fuse circuit and disabling the outputs of the transmission gates.

* * * * *